(12) United States Patent
Ooi et al.

(10) Patent No.: US 11,095,097 B2
(45) Date of Patent: Aug. 17, 2021

(54) INTEGRATED SEMICONDUCTOR OPTICAL AMPLIFIER AND LASER DIODE AT VISIBLE WAVELENGTH

(71) Applicant: King Abdullah University of Science and Technology, Thuwal (SA)

(72) Inventors: Boon Siew Ooi, Thuwal (SA); Chao Shen, Thuwal (SA); Tien Khee Ng, Thuwal (SA)

(73) Assignee: KING ABDULLAH UNIVERSITY OF SCIENCE AND TECHNOLOGY, Thuwal (SA)

(*) Notice: Subject to any disclaimer, the term of this patent is extended or adjusted under 35 U.S.C. 154(b) by 120 days.

(21) Appl. No.: 16/464,186

(22) PCT Filed: Nov. 28, 2017

(86) PCT No.: PCT/IB2017/057461
§ 371 (c)(1),
(2) Date: May 24, 2019

(87) PCT Pub. No.: WO2018/096522
PCT Pub. Date: May 31, 2018

(65) Prior Publication Data
US 2020/0295529 A1    Sep. 17, 2020

Related U.S. Application Data

(60) Provisional application No. 62/426,819, filed on Nov. 28, 2016.

(51) Int. Cl.
*H01S 5/026* (2006.01)
*H01S 5/343* (2006.01)
(Continued)

(52) U.S. Cl.
CPC .......... *H01S 5/34333* (2013.01); *H01S 5/026* (2013.01); *H01S 5/2009* (2013.01);
(Continued)

(58) Field of Classification Search
CPC .......... H01S 5/0625; H01S 5/50; H01S 5/026; H01S 5/04257; H01S 5/04252;
(Continued)

(56) References Cited

U.S. PATENT DOCUMENTS

| | | | |
|---|---|---|---|
| 6,347,106 B1 | 2/2002 | Dijaili et al. | |
| 6,526,083 B1 | 2/2003 | Kneissl et al. | |
| 6,538,808 B1 | 3/2003 | Tastavridis | |
| 6,704,338 B2 * | 3/2004 | Yoshida | H01S 5/50 372/50.1 |
| 6,768,758 B1 | 7/2004 | Hamamoto | |
| 6,813,068 B2 | 11/2004 | Hamamoto | |

(Continued)

FOREIGN PATENT DOCUMENTS

WO    2005114307 A1    12/2005

OTHER PUBLICATIONS

Notification of Transmittal of the International Search Report and the Written Opinion of the International Searching Authority, or the Declaration for PCT/IB2017/057461 dated Mar. 1, 2018.
(Continued)

*Primary Examiner* — Yuanda Zhang
(74) *Attorney, Agent, or Firm* — Billion & Armitage

(57) ABSTRACT

An integrated semiconductor optical amplifier-laser diode (SOA-LD) device includes a laser diode (LD) section fabricated on a substrate, a semiconductor optical amplifier (SOA) section fabricated on the substrate adjacent to the LD section; and a trench formed at least partially between the LD section and SOA section to electrically isolate the LD section and the SOA section while maintaining optical coupling between the LD section and the SOA section.

19 Claims, 10 Drawing Sheets

(51) Int. Cl.
*H01S 5/20* (2006.01)
*H01S 5/22* (2006.01)
*H01S 5/50* (2006.01)
*H01S 5/042* (2006.01)

(52) U.S. Cl.
CPC .............. *H01S 5/22* (2013.01); *H01S 5/2202* (2013.01); *H01S 5/50* (2013.01); *H01S 5/04257* (2019.08)

(58) Field of Classification Search
CPC ...... H01S 5/2009; H01S 5/22; H01S 5/34333; H01S 5/2202
See application file for complete search history.

(56) References Cited

U.S. PATENT DOCUMENTS

| | | | |
|---|---|---|---|
| 7,265,898 B2 | 9/2007 | Wang | |
| 7,643,207 B2 | 1/2010 | Dagens et al. | |
| 8,213,804 B2 | 7/2012 | Sochava | |
| 8,830,563 B2* | 9/2014 | Huhse | G02B 21/0076 359/298 |
| 2004/0042069 A1* | 3/2004 | Fisher | H01S 5/026 359/344 |
| 2008/0273563 A1 | 11/2008 | Schmidt | |
| 2010/0320443 A1* | 12/2010 | Jiang | B82Y 20/00 257/14 |
| 2012/0307620 A1* | 12/2012 | Oka | H01S 5/50 369/112.27 |
| 2018/0287333 A1* | 10/2018 | Ooi | H01S 5/320275 |

OTHER PUBLICATIONS

Kneissl, et al., "Two-section InGaN Multiple-quantum-well laster diode with Integrated Electroabsorption Modulator", Applied Physics Letters, vol. 80, No. 18, May 6, 2002, 3283-3285.

Shen, et al., "High gain semiconductor optical amplifier—Laser diode at visib le wavelength", IEEE International Electron Devices Meeting (IEDM), Ieee,, Dec. 3, 2016, 22.4.1-22.4.4.

Watanabe, et al., "10-W Peak-Power Picosecond Optical Pulse Generation from a Triple Section Blue-Violet Self-Pulsating Laser Diode", Japanese Journal of Applied Physics Express, vol. 3, No. 5, May 1, 2010, 052701-052701-3.

Denbaars, et al., "Development of gallium-nitride-based light-emitting diodes (LEDs) and laser diodes for energy-efficient lighting and displays", S.P. DenBaars et al., Acta Materialia 61, 2013, 945-951.

Dutta, et al., "Semiconductor Optical Amplifiers", Second Edition,, 450 pages.

Lee, et al., "2 Gbit/s data transmission from an unfiltered laser-based phosphor-converted white lighting communication system", Optics Express 29779, vol. 23, No. 23, Nov. 16, 2015, 9 pages.

Pimputkar et al., "Prospects for LED lighting", nature photonics, vol. 3, www.nature.com/naturephotonics, Apr. 2009, 180-182.

Shen, et al., "GHz modulation bandwidth from single-longitudinal mode violet-blue VCSEL using nonpolar InGaN/GaN QWs", Conference on Lasers and Electro-Optics (CLEO) p. STh1L.2, 2016, 2 pages.

Shen, et al., "High-brightness semipolar (2021) blue InGaN/GaN superluminescent diodes for droop-free solid-state lighting and visible-light communications", vol. 41, No. 11, Optics Letters, Jun. 1, 2016, 2608-2611.

Shen, et al., "High-Modulation-Efficiency, Integrated Waveguide Modulator-Laser Diode at 448 nm", Jan. 25, 2016, 262-268.

Shen, et al., "Low Modulation Bias InGaN-based Integrated EA-Modulator-Laser on Semipolar GaN Substrate", Photonics Conference (IPC), p. TuE2.4, 581-582, 2015.

Stubkjaer, "Semiconductor Optical Amplifier-Based All-Optical Gates for High-Speed Optical Processing", IEEE Journal on Selected Topics in Quantum Electronics, vol. 6, No. 6,, Nov./Dec. 2000, 1428-1435.

* cited by examiner

US 11,095,097 B2

INTEGRATED SEMICONDUCTOR OPTICAL AMPLIFIER AND LASER DIODE AT VISIBLE WAVELENGTH

TECHNICAL FIELD

The present disclosure is related to semiconductor devices, and in particular to optoelectronic semiconductor devices.

BACKGROUND

Optoelectronics refers to circuitry—typically semiconductors—utilized to construct optoelectronic devices such as light-emitting diodes (LEDs), superluminescent diodes (SLD), laser diodes (LDs), vertical-cavity surface-emitting laser (VCSELs), and waveguide modulators. Optoelectronic devices are utilized in a variety of applications, including in solid-state lighting (SSL), visible light communications (VLC), optical storage, displays, optical clocking, and sensing applications.

Many of these applications require some form of amplification. An optical amplifier is a type of optical device that amplifies an optical signal directly without needing to first convert it to an electrical signal. A number of different types of optical amplifiers are available for use, including doped fiber amplifiers, semiconductor optical amplifiers (SOAs), and Raman amplifiers.

Typically, optoelectronics utilizing a laser device and an optical amplifier implement these components as individual devices located on individual substrates, or different chips. In this way, devices remain electrically isolated from one another and can be controlled independently. However, it would be beneficial if devices could be fabricated together on the same substrate while maintaining the desired electrical isolation and suppressing thermal roll-over effects in laser diodes operating at high injection conditions.

BRIEF SUMMARY OF THE INVENTION

According to an exemplary embodiment, an integrated semiconductor optical amplifier-laser diode (SOA-LD) device includes a laser diode (LD) section fabricated on a substrate, a semiconductor optical amplifier (SOA) section fabricated on the substrate adjacent to the LD section; and a trench etched at least partially between the LD section and SOA section to electrically isolate the LD section and the SOA section.

DETAILED DESCRIPTION

The present invention relates generally to a monolithically integrated semiconductor optical amplifier-laser diode (SOA-LD). The SOA structure is electrically isolated from the LD structure, but optically coupled to one another. The output generated by the SOA-LD is controlled by the electrical signal provided to the SOA structure as well as the current injected into the LD structure.

Figure 1:
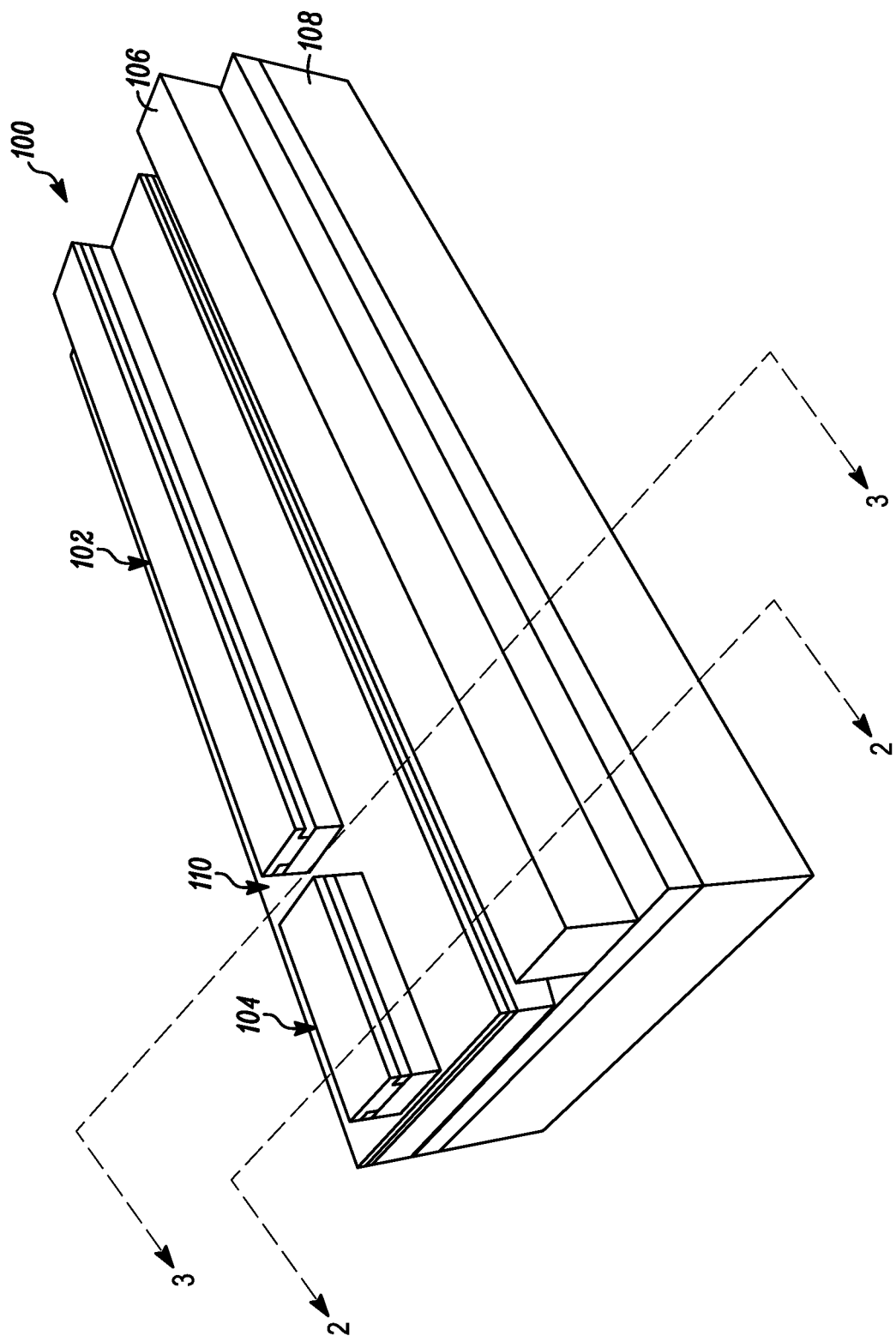
FIG. 1 is a perspective view of the integrated semiconductor optical amplifier-laser diode (SOA-LD) according to an embodiment of the present invention.

FIG. 1 is a perspective view of integrated semiconductor optical amplifier-laser diode (SOA-LD) device 100 according to an embodiment of the present invention. SOA-LD device 100 includes laser diode (LD) section 102, semiconductor optical amplifier (SOA) section 104, contact pad 106, and semiconductor substrate 108. In general, LD section 102, SOA section 104, and contact pad 106 are integrated onto semiconductor substrate 108. In one embodiment, contact pad 106 is an N-type contact pad.

Integrated SOA-LD device 100 is a three-terminal device, with a first terminal providing an input to LD section 102, a second terminal providing an input to SOA section 104, and a third terminal for providing the grounding to the first and second terminals. In one embodiment, a common power supply (not shown) is utilized to provide power to LD section 102 via the first terminal and SOA section 104 via the second terminal. In this embodiment, integrated SOA-LD device 100 generates a laser operating in the visible wavelength region (e.g., 400 nanometers (nm)~800 nm).

The first terminal (located on the top of LD section 102, but not shown in this view) is utilized to provide the drive current (i.e., "LD drive current") to LD section 102, wherein the LD drive current controls generation of the laser output by LD section 102. As discussed in more detail below, the current provided to the LD section (i.e., LD drive current) provides one mechanism for controlling the laser output generated by SOA-LD device 102. Based on the LD drive current, LD section 102 generates a laser output that is provided as an input to SOA section 104, which is optically coupled to LD section 102 via trench 110.

SOA section 104 is positioned adjacent to LD section 102, separated by trench 110 extending partially through the layers associated with LD section 102 and SOA section 104, but optically coupled to LD section 102 via a shared waveguide to receive the laser output generated by LD section 102. The second terminal (also located on the top of SOA section 104, but not shown in this view) is utilized to provide a drive voltage to SOA section 104 (i.e., "SOA drive voltage). As discussed in more detail below, the magnitude of the SOA drive voltage applied to the second terminal determines the magnitude of the optical amplification provided to the received laser output generated by LD section 102.

In the embodiment shown in FIG. 1, SOA section 104 is approximately 300 µm long, and LD section 102 is approximately 1190 µm long. In other embodiments the lengths of the respective sections may be modified, with the length of SOA section 104 varying from approximately 50 micrometer (µm) to approximately one millimeter (mm). Similarly, the length of LD section 102 may vary from approximately 1 mm to approximately 10 mm. Both LD section 102 and SOA section 104 are constructed on top of semiconductor substrate 108. Although not visible in this view, LD section 102 and SOA section 104 share a quantum well (QW) active region layer-structured. The QW active region layers are optically coupled to one another to allow light emitted from LD section 102 to be amplified by SOA section 104. The QW active region utilizes waveguide layers to provide a ridge waveguide (also not shown) to communicate the optical signal.

Isolation trench 110 is located between LD section 102 and SOA section 104 and is etched to a desired depth to provide electrical isolation between the two sections while maintaining seamless optical coupling. As discussed in more detail below, waveguide layers are designed with high lateral resistance to further improve the isolation resistance between LD section 102 and SOA section 104. Maintaining electrical isolation between LD section 102 and SOA section 104 enables the independent operation of the LD section 102 and SOA section 104.

Figure 2:
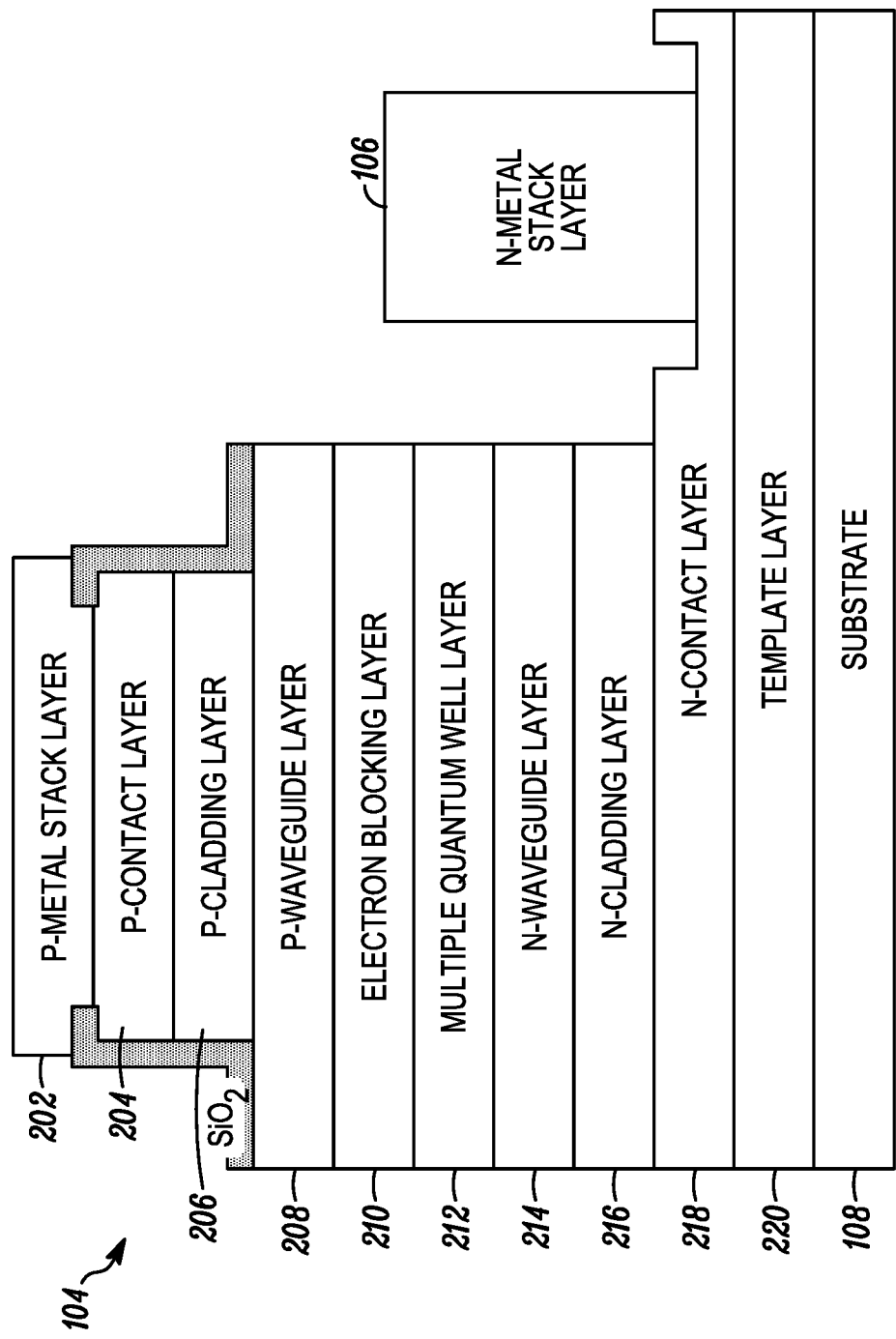
FIG. 2 is a cross-sectional view of an integrated semiconductor optical amplifier-laser diode (SOA-LD) device taken along line 2-2 shown in FIG. 1 according to an embodiment of the present invention.

FIG. 2 is a cross-sectional view of an integrated semiconductor optical amplifier-laser diode (SOA-LD) device 100 according to an embodiment of the present invention. The cross-section is taken across line 2-2 shown in FIG. 1, and illustrates the layers included in SOA section 104 according to an embodiment of the present invention. In the embodiment shown in FIG. 2, the cross-sectional view includes metal stack layer 202, contact layer 204, cladding layer 206, first separate confinement heterostructure (SCH) waveguide layer 208, electron blocking layer 210, multiple quantum well (MQW) layer 212, second SCH waveguide layer 214, cladding layer 216, contact layer 218, template layer 220, and semipolar plane substrate layer 108 (as shown in FIG. 1). In addition, metal stack layer 106 is provided in contact with contact layer 218.

As discussed above, SOA-LD device 100 is a three-terminal device, with one terminal providing an input to LD section 102, another terminal providing an input to SOA section 104, and a third terminal connected to both SOA section 104 and LD section 102. In the embodiment shown in FIG. 2, metal stack layer 202 represents the terminal associated with SOA section 104, while metal stack layer 106 represents the terminal associated with both SOA section 104 and LD section 102 (i.e., connected to the bottom portions of each section). In one embodiment, metal stack layer 202 is comprised of Palladium-Silver (Pd/Au) alloy that provides a conductive contact to SOA section 104.

With respect to SOA section 104, contact layer 204 is connected to metal stack layer 202. In the embodiment shown in FIG. 2, contact layer 204 is comprised of a Magnesium doped p-type Gallium Nitride metal stack layer ($P^+$-GaN). Cladding layer 206 is comprised of a Magnesium-doped p-type Gallium Nitride (P-GaN) layer. SCH waveguide layer 208 is comprised of Magnesium doped p-type Indium-Gallium-Nitride (P-InGaN) layer. Each of the layers 204, 206, and 208 are enclosed within a Silicon-Oxide layer ($SiO_2$). With respect to the perspective view shown in FIG. 1, each of these layers 204, 206, and 208 would be included in the structure extending above from the layer on which SOA section 104 and LD section 102 are located.

The following layers represent layers that may be shared between SOA section 104 and LD section 102. In the embodiment shown in FIG. 2, electron blocking (EBL) layer 210 is comprised of an Aluminum-Gallium-Nitride (AlGaN) layer. Adjacent to the EBL layer 210 is the multiple quantum well (MQW) or active layer 212, which in one embodiment is comprised of four periods of Indium-Gallium-Nitride and Gallium-Nitride (InGaN/GaN) active regions. In particular, the MQW layer 212 is shared by both the SOA section 104 and the LD section 102. In this way, SOA section 104 and LD section 102 are optically coupled with one another. A benefit of this approach is that because the LD section 102 and SOA section 104 share the same MQW or active layer 212, there is no need to use an epitaxial regrowth method to prepare the SOA section with a different active region in order to achieve high gain performance. As a result, fewer manufacturing steps are required in fabricating the integrated SOA-LD device, thereby reducing both the production cost and time of the device.

Adjacent to the MQW layer 212 is another waveguide layer 214, which in this embodiment is comprised of n-type Indium-Gallium-Nitride (N-InGaN) layer. Adjacent to the waveguide layer is cladding layer 216 comprised of n-type Gallium-Nitride (N-GaN). Adjacent to this layer is contact layer 218 comprised of highly doped n-type Gallium-Nitride ($N^+$-GaN), which is in electrical contact with metal stack layer 106. Adjacent to contact layer 218 is template layer 220 comprised of n-type Gallium-Nitride (N-GaN), which in turn is adjacent to semipolar plane Gallium-Nitride (GaN) substrate 108 (as shown in FIG. 1, as well).

In one embodiment, the cladding layer 206 is approximately 600 nanometers (nm) in thickness, SCH waveguide layer 208 and 214 are approximately 60 nm, EBL layers is approximately 16 nm, MQW layer 212 is approximately 3.6-7 nm, and cladding layer 216 is approximately 350 nm. In other embodiment the thickness may be selected as desired. In one embodiment, relative to one another, cladding layers are the thickest layers, followed by waveguide layers, EBL layers, and finally the MQW active region layer. The waveguide layers 208 and 214, EBL layer 210 and MQW layer 212 define a ridge waveguide for communicating the received laser in a direction into or out of the page. In one embodiment, the ridge waveguide has a width of approximately 2 micrometers (μm), although in other embodiments the width may be as small as approximately 1 μm or as large as approximately 10 μm.

As discussed in more detail below, optical amplification requires application of a SOA drive voltage to contact layer 204 via metal stack layer 202. The SOA drive voltage is applied between metal stack layer 202/contact layer 204 (i.e., first terminal) and metal stack layer 106/contact layer 218 (second terminal). As the bias voltage increases, the amplification provided within the active region (i.e., MQW layer 212) increases, thereby amplifying the laser signal within the SOA section.

Figure 3:
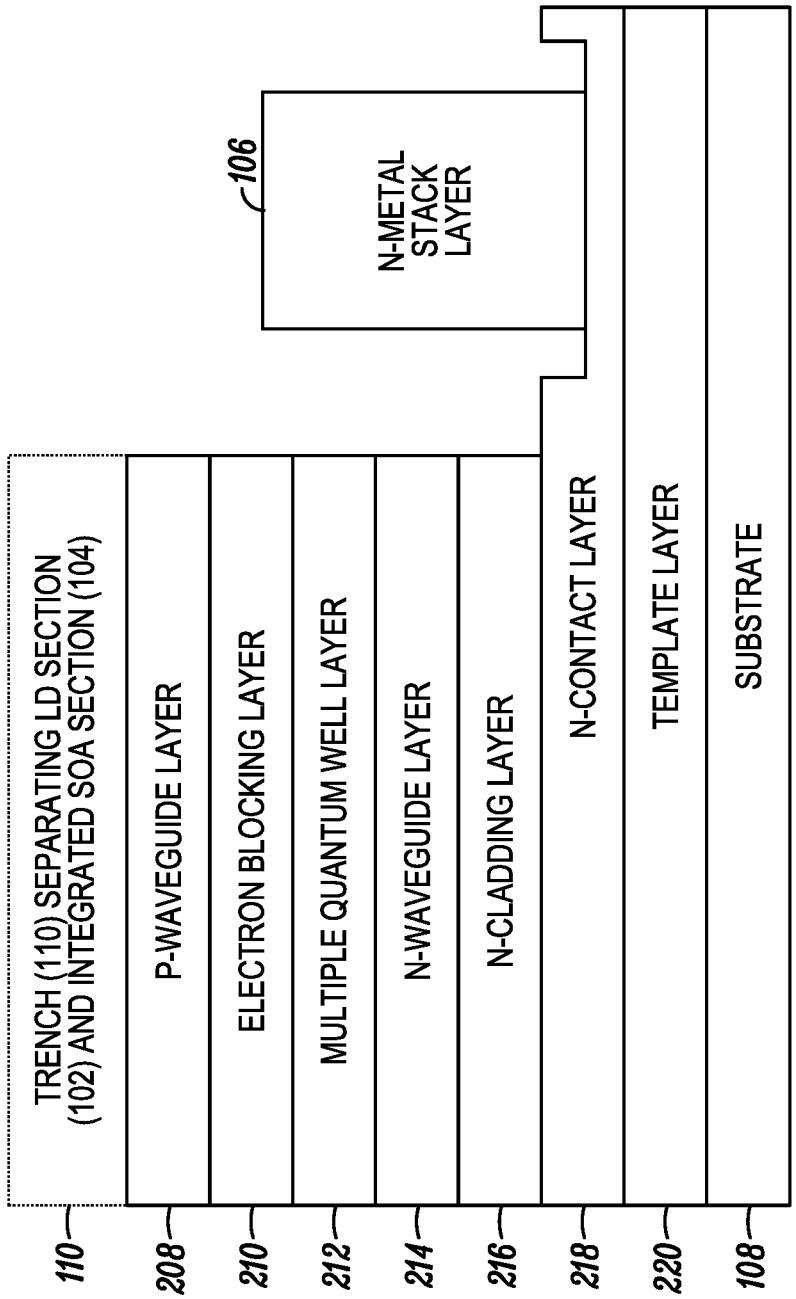
FIG. 3 is a cross-sectional view of an integrated semiconductor optical amplifier-laser diode (SOA-LD) device taken along line 3-3 shown in FIG. 1 according to an embodiment of the present invention.

FIG. 3 is another cross-sectional view of an integrated semiconductor optical amplifier-laser diode (SOA-LD) device according to an embodiment of the present invention. The cross-section is taken across line 3-3 shown in FIG. 1, and illustrates the formation of trench 302 between LD section 102 and SOA section 104 via the removal of several layers. For example, in the embodiment shown in FIG. 3, trench 302 is formed via removal of metal stack layer 202, contact layer 204, and cladding layer 206. In this embodiment, waveguide layer 208, electron blocking layer 210, quantum well layer 212, waveguide layer 214, cladding layer 216, contact layer 218, template layer 220, and substrate 108 remain unchanged from that shown in FIG. 2. In particular, the laser generated by LD section 102 is communicated via waveguide layer 208 to SOA section 104 (shown in cross-section in FIG. 2).

In one embodiment, metal stack layer 202, contact layer 204, and cladding layer 206 are removed via an etching process. During fabrication, these layers are deposited to fabricate LD section 102 and SOA section 104, and then selectively etched/removed to form trench 302. A benefit of this arrangement is that SOA section 104 may be integrated on the same substrate (e.g., substrate 108) as LD section 102, while providing the desired electrical isolation between LD section 102 and SOA section 104. In addition, etching of the respective layers to form trench 302 suppresses thermal roll-over effects of LD section 102 when operating under high injection conditions.

Figure 4:
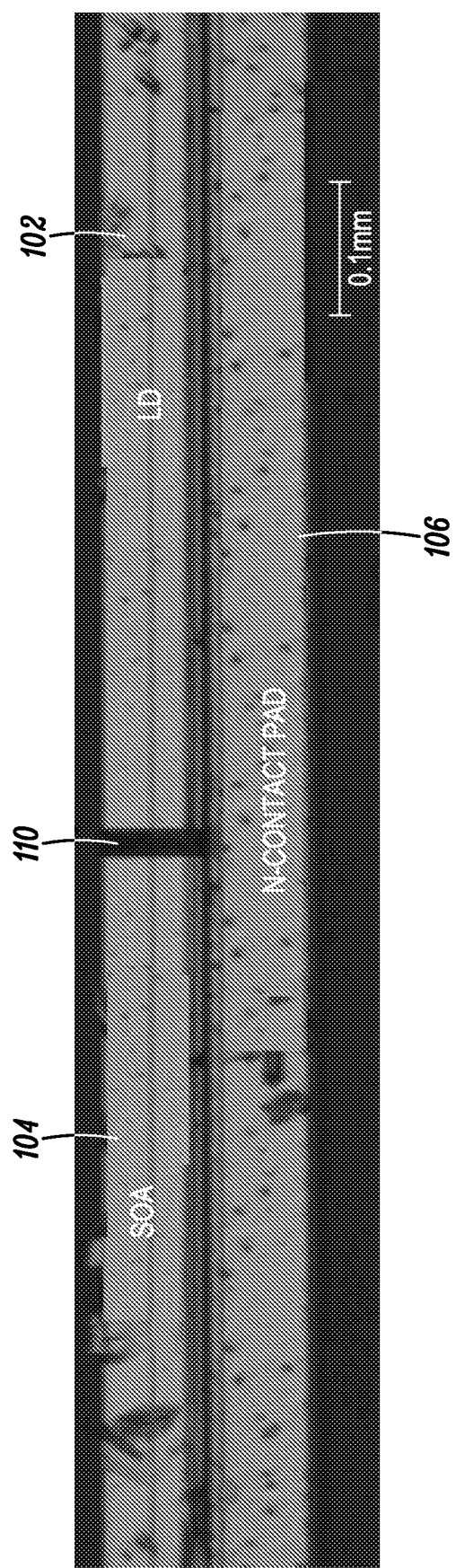
FIG. 4 is a top-view optical microscope image of the integrated semiconductor optical amplifier-laser diode (SOA-LD) according to an embodiment of the present invention.

FIG. 4 is a top-view optical microscope image of the integrated semiconductor optical amplifier-laser diode (SOA-LD) according to an embodiment of the present invention. In the embodiment shown in FIG. 4, at least some of the layers associated with LD section 102 and SOA section 104 are separated by trench 110. As discussed above, trench 110 provides electrical isolation between the two sections, while still allowing them to be optically coupled with one another. In one embodiment, isolation trench is formed as a result of an etching operation. In addition, isolation resistance between the SOA section 104 and LD section 102 is aided by the high lateral resistance of the SCH waveguide layer 208 and EBL layer 210. For example, in one embodiment the isolation resistance between LD section 102 and SOA section 104 is greater than 1 MegaOhm (MΩ), which is several orders of magnitude greater than the junction series resistance, enabling independent electrical operation of the two sections.

FIGS. 5-15 are line charts illustrating experimental results measured with respect to an embodiment of the present invention. Results were obtained by mounting the integrated SOA-LD device 100 on a thermoelectric cooling unit (TEC) (not shown) and testing the device under continuous wave (CW) operation at room temperature. Measurement of the generated laser utilized a direct-current (DC) power source and a calibrated silicon photodetector incorporated in an integrating sphere for accurate measurement of the optical power versus current (L-I) characteristics. In addition, a source measuring unit was utilized to accurately measure the SOA drive voltage applied to SOA section 104, and an optical spectrum analyzer was utilized to obtain emission spectra.

For purposes of this discussion, the driving current providing to LD section 102 is referred to as LD drive current $I_{LD}$ (measured in mA), the bias or driving voltage applied to SOA section 104 is referred to as SOA drive voltage $V_{SOA}$ (measured in V), and the lasing threshold is referred to as lasing threshold $I_{th}$.

Figure 5:
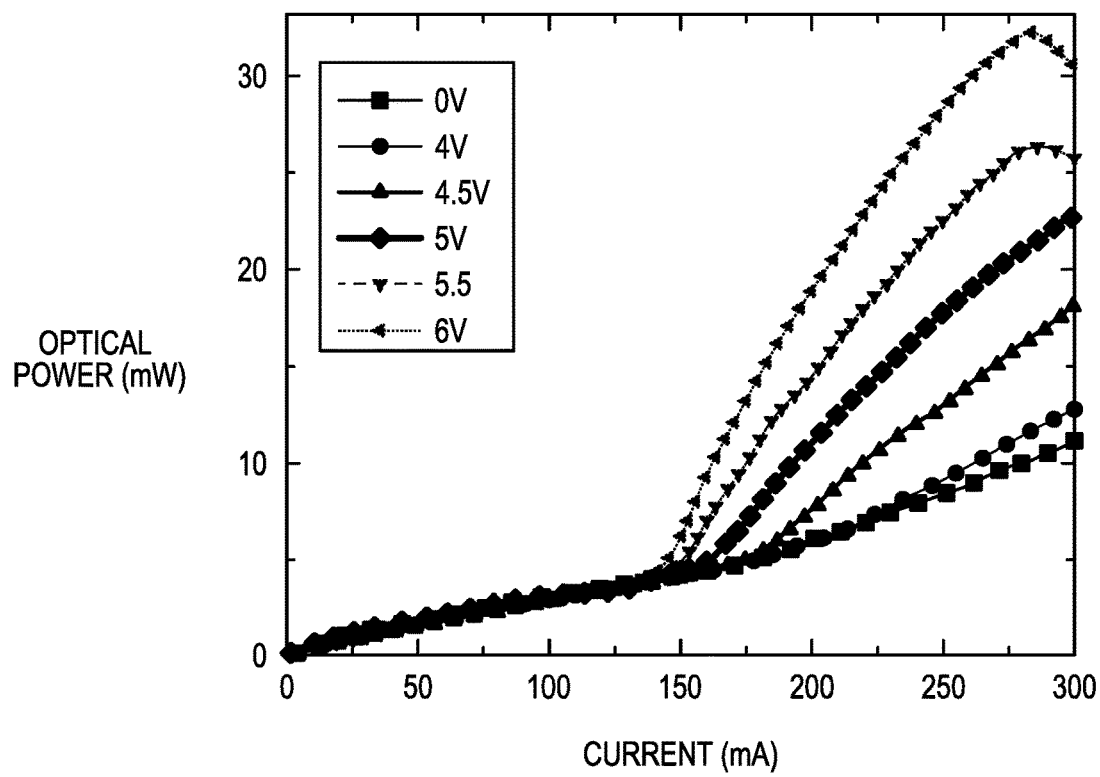
FIG. 5 is a line chart that illustrates for a plurality of semiconductor optical amplifier (SOA) drive voltages applied to the SOA section of the SOA-LD device the light output generated as a function of the laser diode (LD) driving current according to an embodiment of the present invention.

FIG. 5 is a line chart that illustrates for a plurality of SOA drive voltages $V_{SOA}$ it the optical power generated as a function of the LD drive current $I_{LD}$ according to an embodiment of the present invention. The LD drive current $I_{LD}$ is illustrated along the x-axis, while the optical power (measured in milli-watts (mW)) is illustrated along the y-axis. Measurements are recorded for a plurality of SOA drive voltages $V_{SOA}$, including voltages of 0V, 4V, 4.5V, 5V, 5.5V, and 6V. As expected, as the LD drive current $I_{LD}$ increases from 0 mA to 300 mA, the optical output increases. In the embodiment shown in FIG. 5, without application of any SOA drive voltage $V_{SOA}$ (e.g., $V_{SOA}=0$ V), the threshold current ($I_{th}$) is equal to approximately 229 mA. Further increase in the LD drive current ($I_{LD}=250$ mA) results in the optical output power increasing to 8.2 mW. Applying a SOA drive voltage $V_{SOA}>4$V results in an increase in optical power and a decrease in the lasing threshold current.

Figure 6:
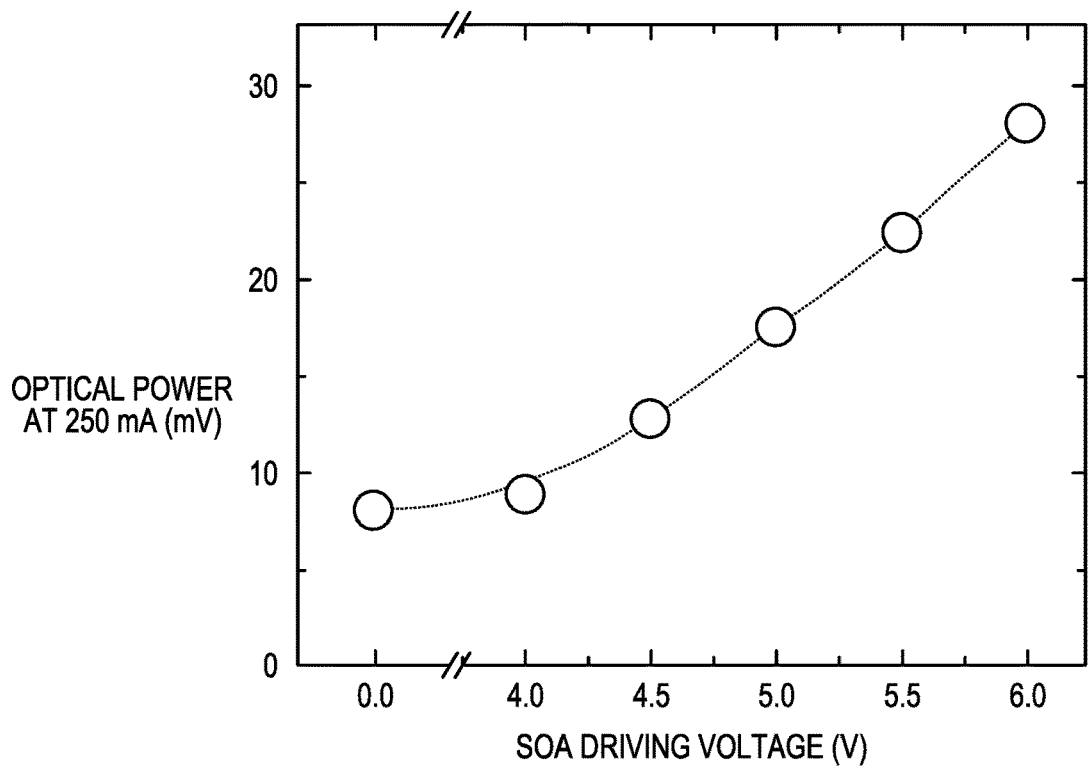
FIG. 6 is a line chart that illustrates optical power generated as a function of SOA drive voltage for a given LD drive current according to an embodiment of the present invention.

FIG. 6 is a line chart that illustrates optical power generated as a function of SOA drive voltage $V_{SOA}$ it for a given LD drive current $I_{LD}$ according to an embodiment of the present invention. In particular, in the embodiment shown in FIG. 6, the LD drive current $I_{LD}=250$ mA, and the SOA drive voltage $V_{SOA}=0.0$, 4.0, 4.5, 5.0, 5.5, and 6.0 V, respectively. FIG. 6 illustrates the strong dependence of optical power on the SOA drive voltage $V_{SOA}$, indicating the light output amplitude amplification effect. The optical power measured with the LD drive current $I_{LD}=250$ mA is increased to 9.0, 12.9, 17.5, 22.3, and 28.0 mW as the SOA drive voltage $V_{SOA}$ is increased from 4.0, 4.5, 5.0, 5.5 and 6.0 V, respectively.

Figure 7:
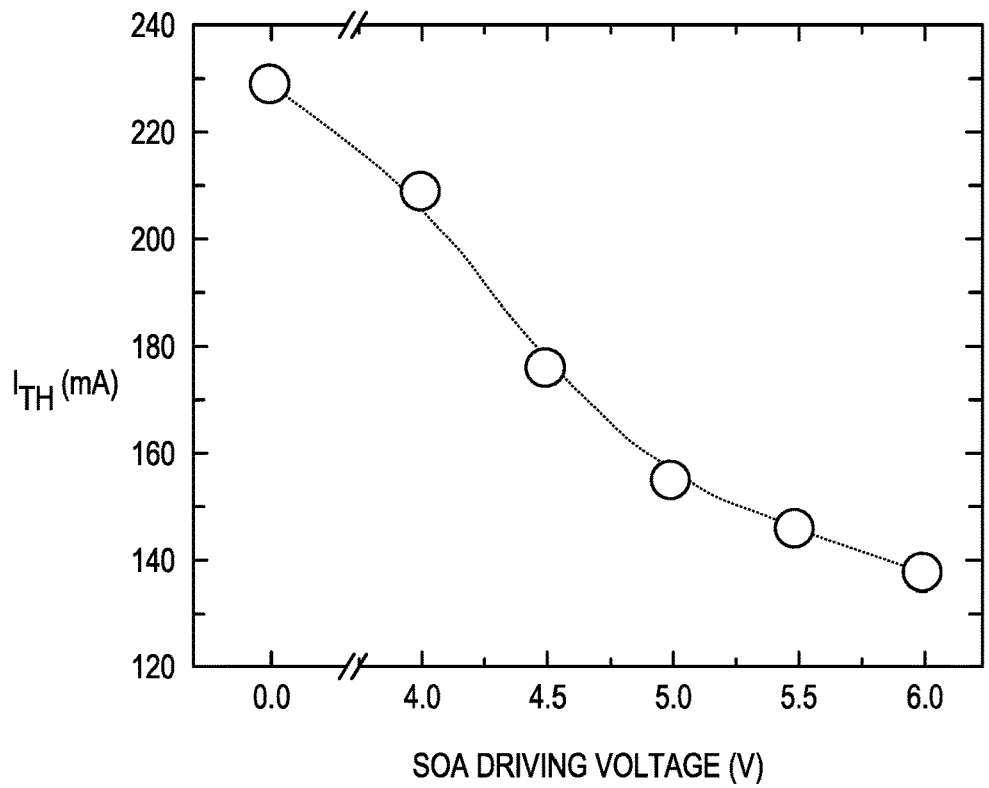
FIG. 7 is a line chart that illustrates lasering threshold currents of the SOA-LD device as a function of SOA drive voltage according to an embodiment of the present invention.

FIG. 7 is a line chart that illustrates lasing threshold current $I_{th}$ of the SOA-LD device as a function of SOA drive voltage $V_{SOA}$ according to an embodiment of the present invention. In the embodiment shown in FIG. 6, the lasing threshold $I_{th}$ decreases as the SOA drive voltage $V_{SOA}$ increases. In particular, threshold current $I_{th}$ is reduced to 209, 176, 155, 146, and 138 mA in response to the SOA drive voltage $V_{SOA}=4.0$, 4.5, 5.0, 5.5 and 6.0 V, respectively.

Figure 8:
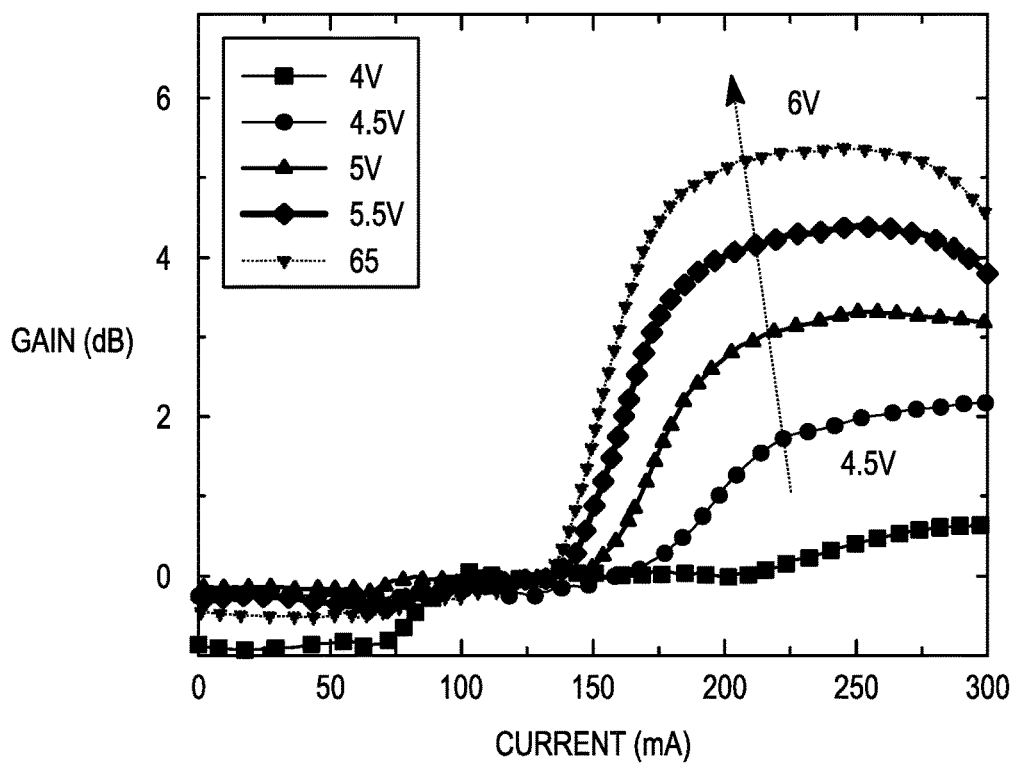
FIG. 8 is a line chart that illustrates for a plurality of SOA drive voltages the gain realized as a function of the LD drive current according to an embodiment of the present invention.

FIG. 8 is a line chart that illustrates for a plurality of SOA drive voltages $V_{SOA}$ the gain realized as a function of the LD driving current according to an embodiment of the present invention. In particular, the embodiment shown in FIG. 8 illustrates the SOA gain curves increase as the SOA drive voltage $V_{SOA}$ increases from 4.0 V to 6.0 V. The gain is calculated as function of the output power at a given SOA drive voltage $V_{SOA}$ and the output power when the SOA drive voltage $V_{SOA}$=0V, as indicated by the following equation:

$$\text{Gain} = \frac{\text{output power at } SOA \text{ bias voltage of } V_{SOA}}{\text{output power at zero } SOA \text{ bias voltage}} \quad (1)$$

In the embodiment shown in FIG. 8, gain saturation is observed when the LD drive current $I_{LD}$>250 mA, as indicated by the plateauing of the gain values.

Figure 9:
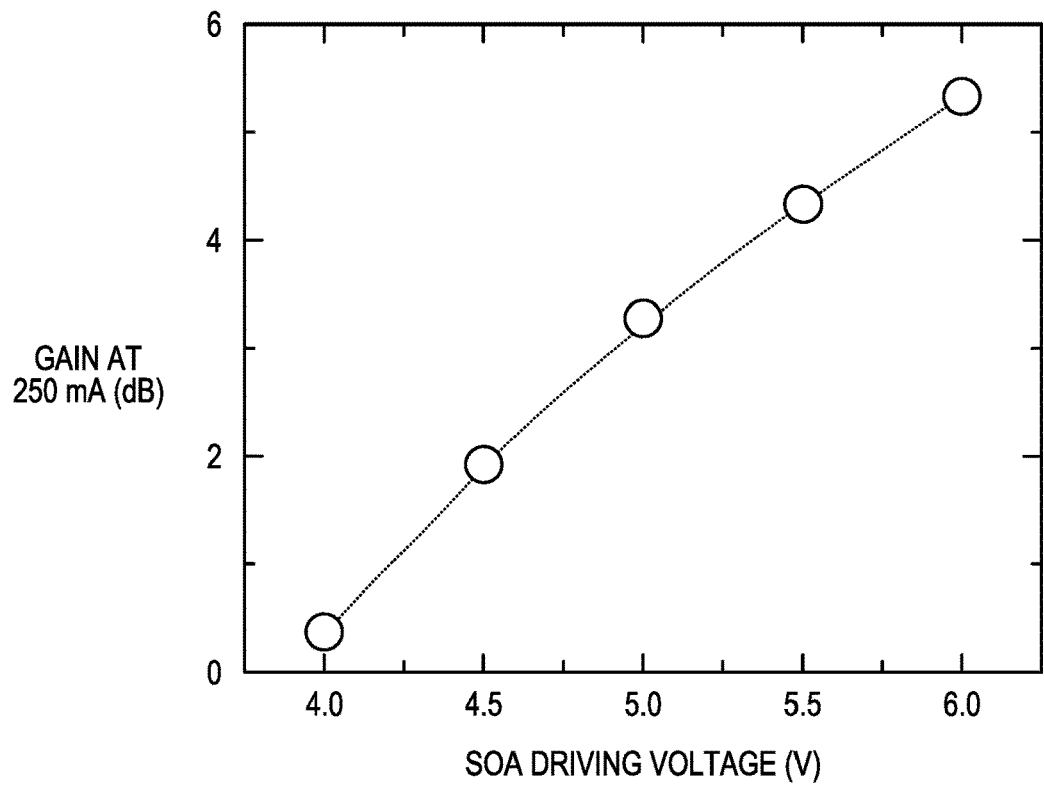
FIG. 9 is a line chart that illustrates the gain realized as a function of SOA drive voltage for a given LD drive current according to an embodiment of the present invention.

FIG. 9 is a line chart that illustrates the gain realized as a function of SOA drive voltage $V_{SOA}$ for a given LD drive current $I_{LD}$ according to an embodiment of the present invention. In particular, FIG. 9 shows the changes in gain observed at a particular LD drive current $I_{LD}$=250 mA as a function of increasing SOA drive voltage $V_{SOA}$. As illustrated, the gain increases with increasing SOA drive voltage $V_{SOA}$.

FIGS. 10-15 illustrate measurements associated with the emission spectra of the SOA-LD device at varying LD drive currents $I_{LD}$ and SOA drive voltages $V_{SOA}$.

Figure 10:
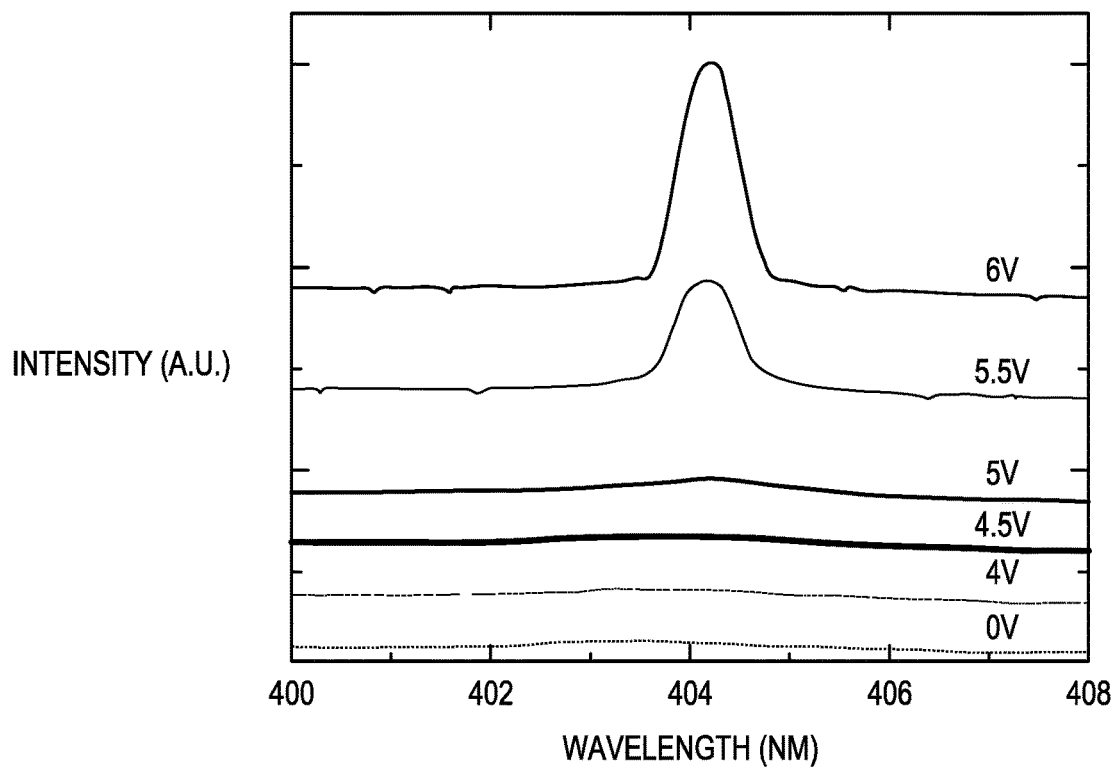
FIG. 10 is a line chart that illustrates the intensity realized for a plurality of SOA drive voltages as a function of wavelength according to an embodiment of the present invention.

FIG. 10 is a line chart that illustrates the intensity realized for a plurality of SOA drive voltage $V_{SOA}$ as a function of wavelength according to an embodiment of the present invention. In the embodiment shown in FIG. 10, the LD drive current $I_{LD}$ is set equal to 160 mA, and the SOA drive voltage $V_{SOA}$ is increased from 0 V to 6 V. As illustrated, the onset of lasing peak occurs at approximately 404 nm is observed at $V_{SOA}$>5 V with significantly increased peak intensity and narrowed full width at half maximum (FWHM). When SOA drive voltage $V_{SOA}$ is equal to 5.5 V, the FWHM of the emission peak is measured to be 0.68 nm, confirming the appearance of stimulation emission from SOA-LD device 100.

Figure 11:
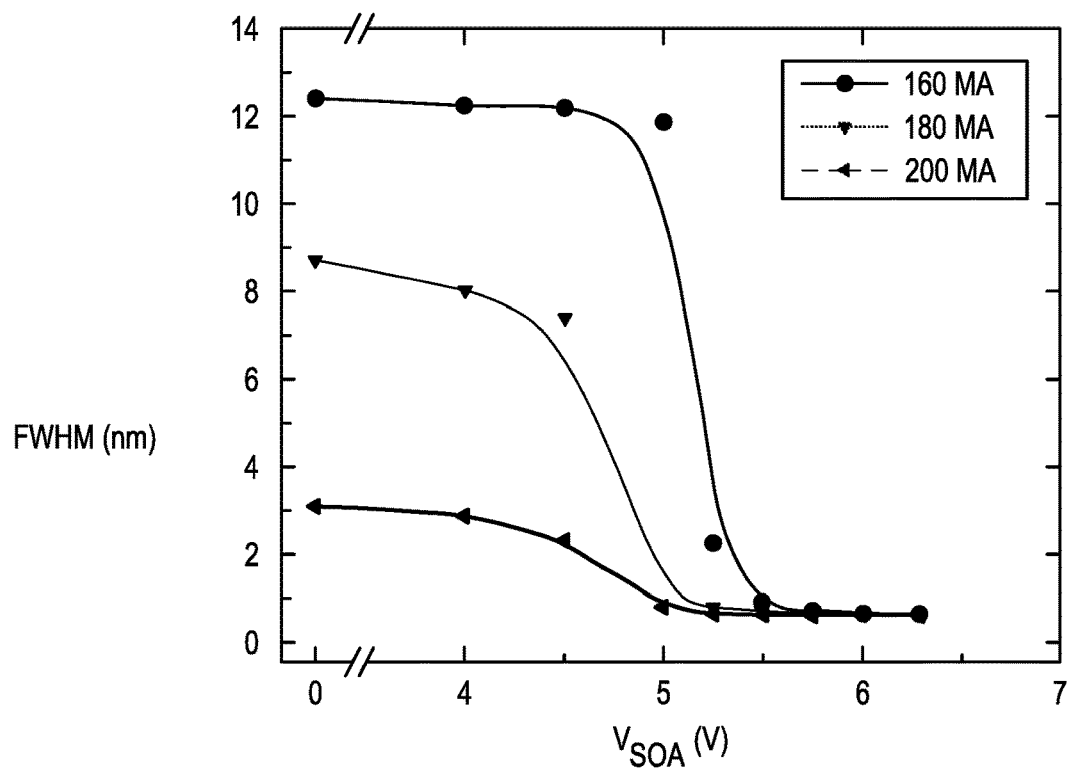
FIG. 11 is a line chart that illustrates for a plurality of LD drive currents the full width at half maximum (FWHM) of the SOA-LD emission spectra as function of SOA drive voltage according to an embodiment of the present invention.

FIG. 11 is a line chart that illustrates for a plurality of LD drive currents $I_{LD}$ the full width at half maximum (FWHM) of the SOA-LD emission spectra as function of SOA drive voltage $V_{SOA}$ according to an embodiment of the present invention. That is, FIG. 11 illustrates the dependence of the measured FWHM on SOA drive voltage $V_{SOA}$ at different LD drive currents $I_{LD}$. Based on the narrowing of peak FWHM to less than 2 nm, lasing is observed at SOA drive voltages $V_{SOA}$ greater than 5 V and greater than 4.5 V when a LD drive current $I_{LD}$ is 160 mA and 200 mA, respectively. In addition, there is an insignificant change of FWHM and emission wavelength for the lasing peak as the drive voltage $V_{SOA}$ changes, after SOA-LD device 100 enters the stimulated emission regime.

Figure 12:
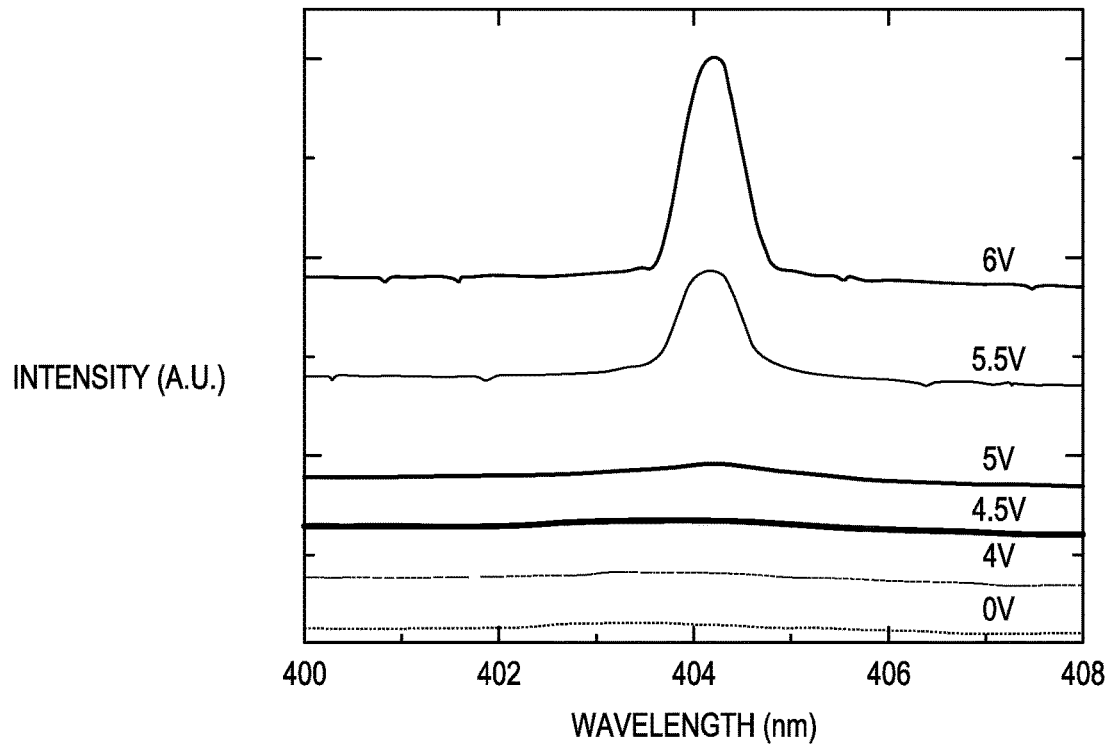
FIG. 12 is a line chart that illustrates for a plurality of SOA drive voltages the intensity generated as a function of the wavelength according to an embodiment of the present invention.

FIG. 12 is a line chart that illustrates for a plurality of SOA drive voltage $V_{SOA}$ the intensity generated as a function of the wavelength according to an embodiment of the present invention. In particular, FIG. 10 compares the emission spectra generated using LD drive current $I_{LD}$ equal to 200 mA with a SOA drive voltage $V_{SOA}$ varied from 0 V to 6 V. When the SOA drive voltage $V_{SOA}$ is equal to 6 V, the device shows a narrow lasing peak at approximately 404 nm. As discussed above, a peak amplification ratio $R_{AMP}$—defined as the intensity measured when the SOA drive voltage $V_{SOA}$ is set equal to 6 V over the intensity measured when the SOA drive voltage $V_{SOA}$ is set equal to 0 V—is maximized at the lasing wavelength indicating the effective amplification effect of the integrated SOA section 104. A relatively low amplification ratio $R_{AMP}$ of approximately 1.5 is measured for the rest of the spectrum range, suggesting a minimized amplification effect for the spontaneous component of the emission.

Figure 13:
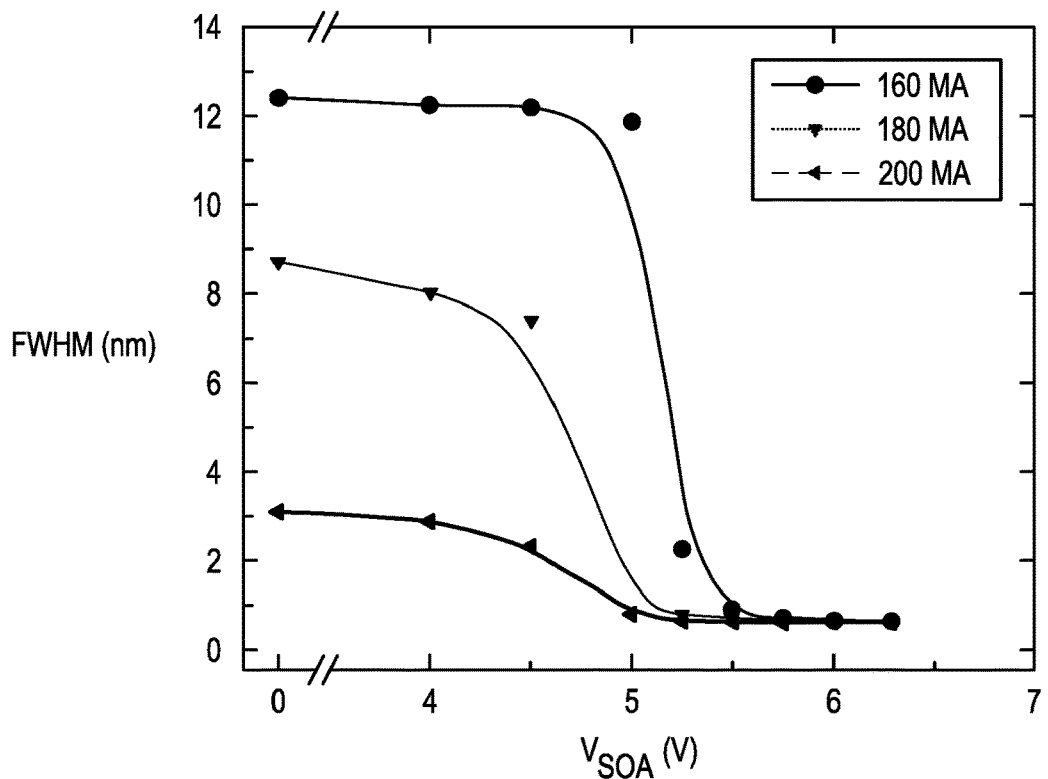
FIG. 13 is a line chart that illustrates for a plurality of LD drive currents the full width at half maximum (FWHM) of the SOA-LD emission spectra as function of SOA drive voltage according to an embodiment of the present invention.

FIG. 13 is a line chart that illustrates for a plurality of LD drive currents $I_{LD}$ the full width at half maximum (FWHM) of the SOA-LD emission spectra as function of SOA drive voltage $V_{SOA}$ according to an embodiment of the present invention. The amplification ratio $R_{AMP}$ increases for the lasing peak, from 1.14 to 16.9, is identified with increasing SOA drive voltage $V_{SOA}$ from 4 V to 6 V, while the amplification ration $R_{AMP}$ remain constant from about 1.3 to about 1.5 V for spontaneous emission components. That is, the stimulated emission component is dominantly amplified compared to the spontaneous emission component. As a result, the SOA section 104 serves as an efficient amplifier to the demonstrated SOA-LD device.

Figure 14A:
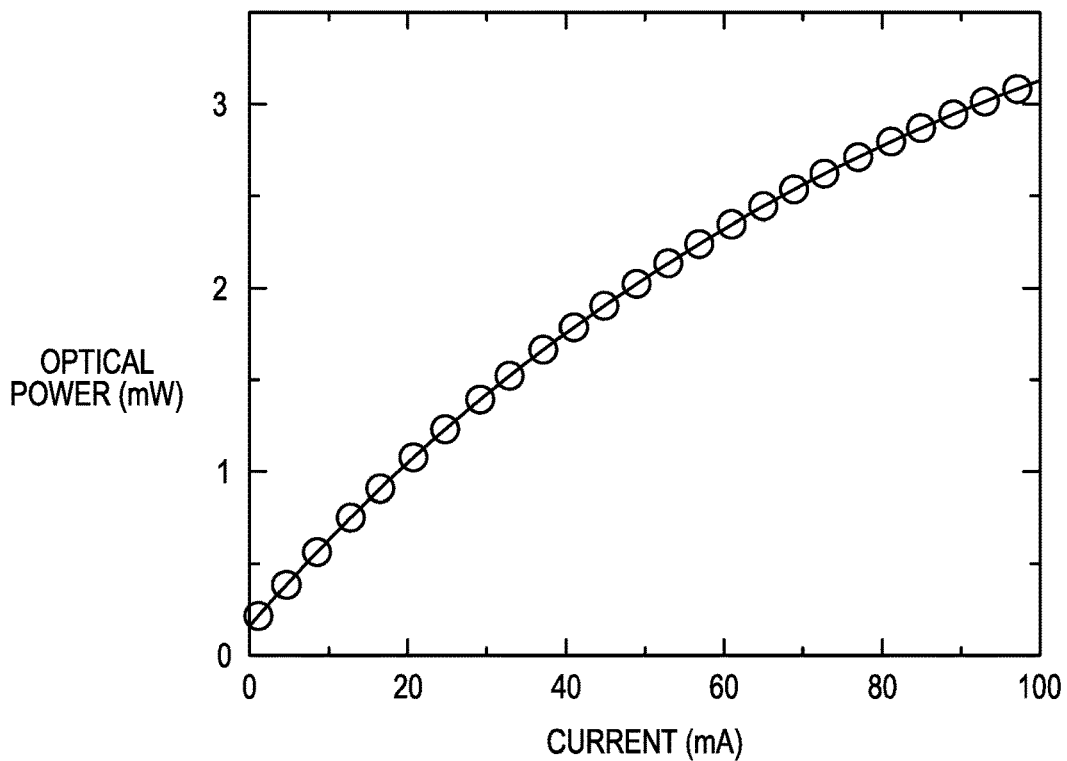
FIG. 14A is a line chart that illustrates optical power generated as a function of current in the SOA section according to an embodiment of the present invention.
Figure 14B:
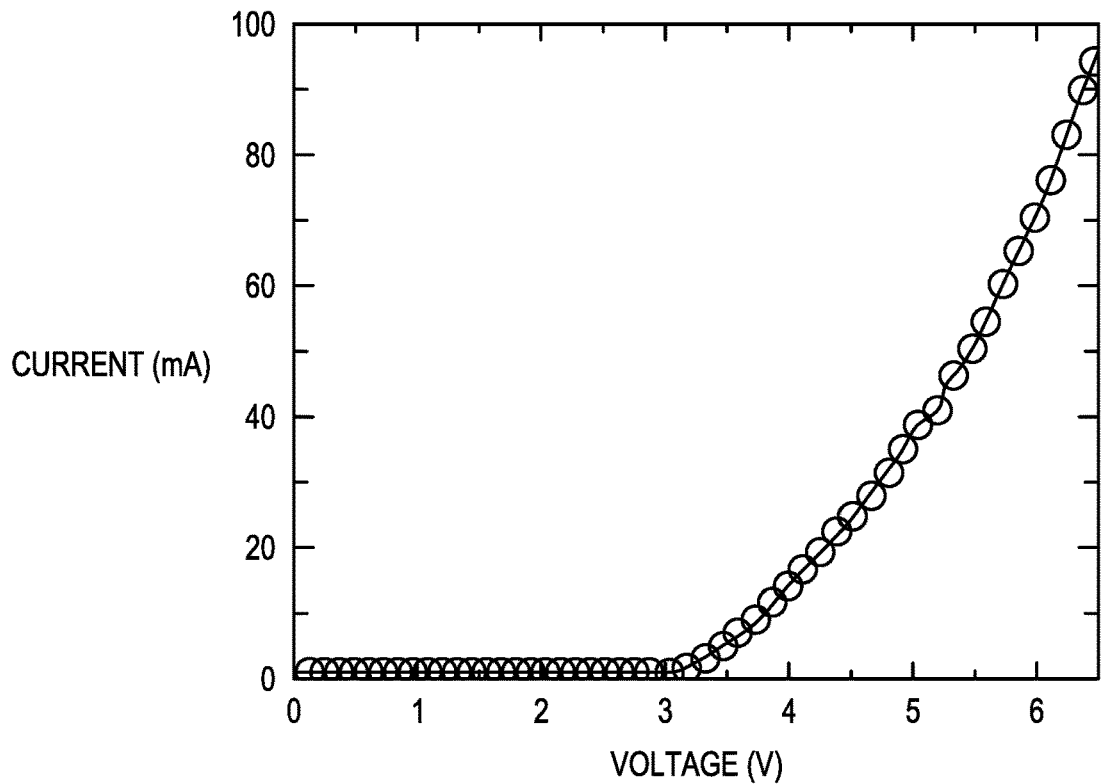
FIG. 14B is a line chart that illustrates current in the SOA section as a function of SOA drive voltage according to an embodiment of the present invention.
Figure 15:
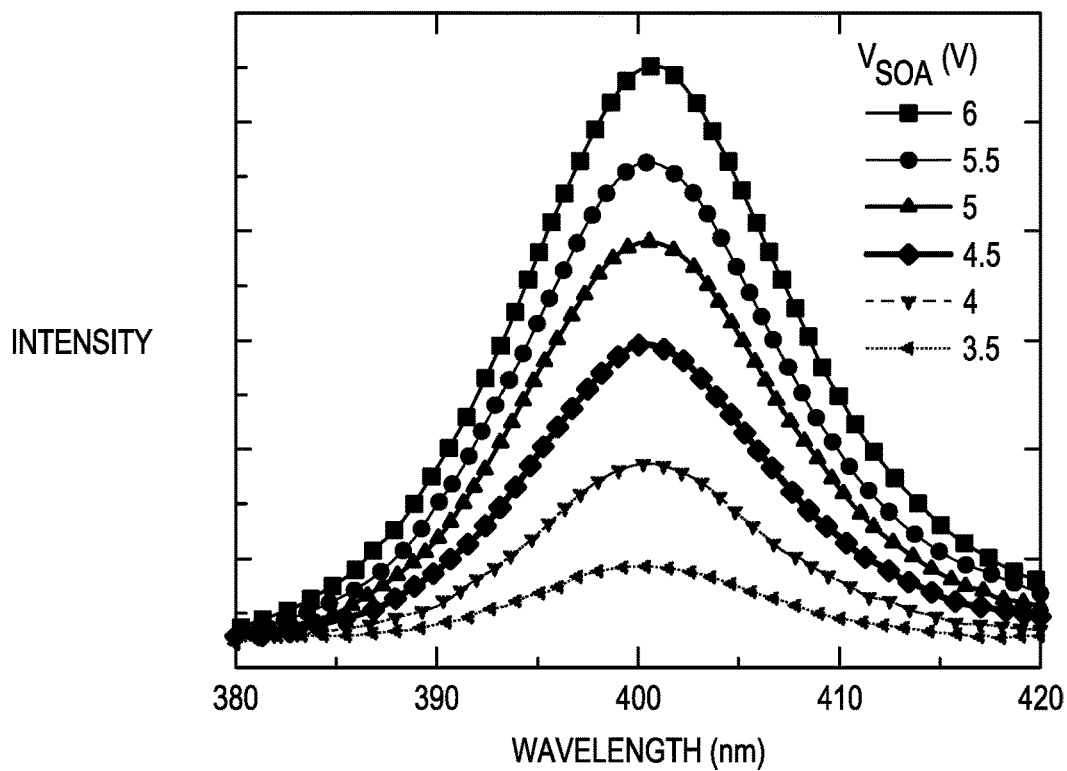
FIG. 15 is a line chart that illustrates for a plurality of SOA drive voltages the intensity generated as a function of wavelength according to an embodiment of the present invention.

FIGS. 14a-15 confirm that the measurements and observations discussed with respect to FIGS. 5-13 originate solely from the amplification effect of SOA section 104, and not from an independent laser component operating at a high bias voltage. To do this, SOA section 104 is characterized with LD drive current $I_{LD}$ set equal to 0 mA. The relationship between optical power and current in SOA section 104 (i.e., L~$I_{SOA}$) and SOA drive voltage $V_{SOA}$ vs. current in SOA section 104 ($I_{SOA}$)—while the LD drive current $I_{LD}$ is set equal to zero are illustrated in FIGS. 14a and 14b. In particular, FIG. 14a is a line chart that illustrates optical power generated as a function of current in the SOA section $I_{SOA}$ according to an embodiment of the present invention, and FIG. 14b is a line chart that illustrates current in the SOA section $I_{SOA}$ as a function of SOA drive voltage $V_{SOA}$ according to an embodiment of the present invention. In particular, when the SOA drive voltage $V_{SOA}$ equals to 6 V, the SOA current $I_{SOA}$ is approximately 71 mA, corresponding to a current density of 11.83 kA/cm². From the measured L~$I_{SOA}$ relation, we have not observed the onset of stimulated emission or amplified spontaneous emission at SOA section current $I_{SOA}$ up to 100 mA. This is further supported by the collected emission spectra illustrated in FIG. 15.

FIG. 15 is a line chart that illustrates for a plurality of SOA drive voltages $V_{SOA}$ the intensity generated as a function of wavelength according to an embodiment of the present invention. With the LD drive current $I_{LD}$=0 mA, the emission peak shows a large FWHM greater than 15 nm at a SOA drive voltage $V_{SOA}$ equal to 6 V, indicating its spontaneous emission nature. Therefore, the observed amplification effect in SOA-LD device 100 is attributed to the integrated optical amplifier (e.g., integrated InGaN-based semiconductor optical amplifier).

In this way, the present disclosure provides an integrated short-wavelength semiconductor optical amplifier with laser diode device (SOA-LD). In one embodiment, the SOA-LD device operates at a frequency of approximately 404 nm, and is based on an Indium-Gallium-Nitride/Gallium-Nitride (InGaN/GaN) multiple quantum wells (MQWs). Benefits of the present invention include efficient amplification effect provided by the SOA section, which reduces the drive current required to be provided to the LD section, as well as increase optical power and gain via application of the drive voltage to the SOA section. In addition, utilization of a nitride based integrated SOA allows for effective amplification in the violet-blue-green spectrum range, and enables high power operation of the laser by extending the thermal roll-over to a significantly higher output power.

While the invention has been described with reference to an exemplary embodiment(s), it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment(s) disclosed, but that the invention will include all embodiments falling within the scope of the appended claims.

The invention claimed is:

1. An integrated semiconductor optical amplifier-laser diode (SOA-LD) device comprising:
   a laser diode (LD) section fabricated on a substrate;
   a semiconductor optical amplifier (SOA) section fabricated on the substrate adjacent to the LD section; and
   a trench formed at least partially between the LD section and SOA section to electrically isolate the LD section and the SOA section;
   wherein the SOA section is a nitride-based integrated SOA that functions in a visible wavelength (400 nm to 800 nm);
   wherein the LD section and the SOA section share a first plurality of semiconductor layers, the first plurality of semiconductor layers comprising an electron blocking layer to aid electrical isolation of the LD section and the SOA section.

2. The integrated SOA-LD device of claim 1, wherein the LD section further includes at least a first terminal, wherein the first terminal provides a LD drive current to the LD section without affecting the SOA section.

3. The integrated SOA-LD device of claim 2, wherein the first plurality of semiconductor layers further comprises a contact layer, at least one waveguide layer and an active region, wherein the LD section generates a laser signal.

4. The integrated SOA-LD device of claim 3, wherein the trench is formed between the LD section and SOA section by selectively removing the contact layer, without removing the waveguide layer such that the LD section and SOA section remain optically coupled via the waveguide layer.

5. The integrated SOA-LD device of claim 3, wherein the SOA section amplifies the laser signal.

6. The integrated SOA-LD device of claim 2, wherein the SOA section further includes at least a second terminal, wherein the second terminal provides an SOA drive voltage to the SOA section without biasing the LD section.

7. The integrated SOA-LD device of claim 6, wherein the trench formed between the LD section and the SOA section results in removal of a contact layer associated with the first terminal on the LD section and second terminal on the SOA section to electrically isolate the LD section from the SOA section.

8. The integrated SOA-LD device of claim 7, wherein the SOA drive voltage controls amplification of a laser signal generated in the LD section, and transmitted within the SOA section.

9. The integrated SOA-LD device of claim 1, wherein an output power associated with a generated laser light is controlled via application of a drive current to the LD section via a first terminal and via application of a SOA drive voltage to the SOA section via a second terminal.

10. The integrated SOA-LD device of claim 9, wherein at least one common ground terminal is presented to provide a current path for the operation of LD section and SOA section.

11. The integrated SOA-LD device of claim 9, wherein the output power of the integrated SOA-LD device is controlled using a power supply unit.

12. The integrated SOA-LD device of claim 1, wherein the first plurality of semiconductor layers defines a ridge waveguide.

13. The integrated SOA-LD device of claim 12, wherein the ridge waveguide comprises a P-waveguide layer, the electron blocking layer, a multiple quantum well layer, and a N-waveguide layer.

14. The integrated SOA-LD device of claim 13 wherein the waveguide layers are Indium-Gallium-Nitride (InGaN) layers, the electron blocking layer is an Aluminum-Gallium Nitride layer (AlGaN), and the multiple quantum well layer includes a plurality of periods of Indium-Gallium-Nitride and Gallium-Nitride (InGaN/GaN) active regions.

15. A method of fabricating an integrated SOA-LD device that includes a laser diode (LD) device and a semiconductor optical amplifier (SOA), the method comprising:
   depositing a first plurality of semiconductor layers on a substrate to fabricate waveguide layers and an active region comprised of a plurality quantum well layers, the plurality of quantum well layers including a plurality of periods of Indium- Gallium-Nitride and Gallium-Nitride (InGaN/GaN) active regions, wherein the first plurality of semiconductor layers are utilized for both the LD device and the SOA device;
   depositing a second plurality of semiconductor layers on top of the first plurality of semiconductor layers to fabricate contacts, wherein the second plurality of semiconductor layers are utilized for both the LD device and the SOA device; and
   forming an isolation trench between the LD device and the SOA device by etching a portion of the second plurality of semiconductor layers to form an isolation trench between the LD device and the SOA device, wherein the first plurality of semiconductor layers is not etched.

16. The method of claim 15, wherein waveguide layers include a P-waveguide layer and an N-waveguide layer.

17. The method of claim 16, wherein the P-waveguide layer is a p-type Indium-Gallium-Nitride (P-InGaN) layer.

18. The method of claim 17, wherein the N-waveguide layer is an n-type Indium-Gallium-Nitride (N-InGaN) layer.

19. The method of claim 15, wherein the first plurality of semiconductor layers further includes a cladding layer and an electron blocking layer, wherein the waveguide layers, the electron blocking layer, and quantum well layers define a ridge waveguide.

* * * * *